(12) United States Patent
Sakamoto et al.

(10) Patent No.: US 7,989,799 B2
(45) Date of Patent: Aug. 2, 2011

(54) SURFACE LIGHT EMITTING ELEMENT

(75) Inventors: Ryo Sakamoto, Chiyoda-ku (JP);
Masatoshi Iwata, Chiyoda-ku (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 123 days.

(21) Appl. No.: 12/225,714

(22) PCT Filed: Mar. 27, 2007

(86) PCT No.: PCT/JP2007/056312
§ 371 (c)(1),
(2), (4) Date: Sep. 29, 2008

(87) PCT Pub. No.: WO2007/116713
PCT Pub. Date: Oct. 18, 2007

(65) Prior Publication Data
US 2009/0272963 A1    Nov. 5, 2009

(30) Foreign Application Priority Data
Mar. 31, 2006   (JP) .................................. 2006-097869

(51) Int. Cl.
*H01L 29/06* (2006.01)
(52) U.S. Cl. .................................. 257/14; 257/E29.072
(58) Field of Classification Search .................... 257/13, 257/14, E29.072
See application file for complete search history.

(56) References Cited

FOREIGN PATENT DOCUMENTS

| JP | 07-245449 | 9/1995 |
|---|---|---|
| JP | 09-260783 | 10/1997 |
| JP | 10-027945 | 1/1998 |
| JP | 10-242512 | 9/1998 |
| JP | 10-294530 | 11/1998 |
| JP | 2000-174327 | 6/2000 |
| JP | 2000-174328 | * 6/2000 |
| JP | 2002-111053 | 4/2002 |
| JP | 2002-111054 | 4/2002 |
| JP | 2002-217488 | 8/2002 |
| JP | 2003-318495 | 11/2003 |
| JP | 2004-179428 | 6/2004 |
| WO | 94/07344 | 3/1994 |

OTHER PUBLICATIONS

International Search Report issued Jun. 19, 2007 in International (PCT) Application PCT/JP2007/056312.

* cited by examiner

*Primary Examiner* — W. David Coleman
(74) *Attorney, Agent, or Firm* — Wenderoth, Lind & Ponack, L.L.P.

(57) ABSTRACT

Provided is a surface light emitting element having a high productivity, a high light emission output and good response characteristics, as well as capable of suppressing an increase of a forward voltage necessary for light emission. A surface light emitting element according to the present invention is a vertical cavity surface light emitting element including: an active layer 5 in which a quantum well layer 51 and a barrier layer 52 are alternately laminated; and reflective layers disposed both above and below the active layer 5, wherein assuming that a center-to-center distance of a plurality of the quantum well layers is L, a light emission wavelength of the surface light emitting element is λ, and an average refractive index of an optical length of a resonator, being a distance between the reflective layers is n, a condition of $\lambda/(15 \times n) \leq L \leq \lambda/(10 \times n)$ is satisfied.

8 Claims, 6 Drawing Sheets

(A)

(B)

SURFACE LIGHT EMITTING ELEMENT

TECHNICAL FIELD

The present invention relates to a surface light emitting element. In particular, the present invention relates to a surface light emitting element that has a high productivity, and a high light emission output and good response characteristics, as well as that can suppress an increase of a forward voltage necessary for light emission. Furthermore, the present invention relates to a vertical cavity surface light emitting element with which a still higher light emission output can be obtained.

BACKGROUND ART

Recently, the need for a data communication network at high speed and of a large capacity is constantly increasing. Accompanied therewith, as an indoor or in-car data communication network, there has been increasing interest in a data communication network using a plastic optical fiber (POF). A light source of this data communication network is required to have high power and high-speed response characteristics. As a light emitting element having these two characteristics, there is a surface light emitting element (for example, a light emitting diode) having a resonator structure.

The surface light emitting element having the resonator structure has the structure (vertical resonator) which resonates light from an active layer in a vertical direction with respect to the active layer by sandwiching the active layer between two reflective layers. In the vertical cavity structure, when the active layer is to be a quantum well layer, high-speed response characteristics are achieved. Furthermore, the formation of a plurality of quantum well layers allows a higher light emission output.

In Patent Document 1, disclosed is a light emitting diode in which an active layer is to be a single quantum well layer with small thickness, and impurities are doped into two barrier layers sandwiching the quantum well layer therebetween and the quantum well layer, thereby improving response characteristics.

In Patent Document 2, disclosed is a light emitting diode in which the length of the resonator is set to be half of a light emission wavelength, a plurality of quantum well layers is provided at the central portion of the resonator, and thereby a plurality of the quantum well layers lies in positions to be an anti-node of a standing wave in the resonator. In this light emitting diode, there is included on both sides of each of the plurality of the quantum well layers tunnel barrier layers. Further, the thickness of each pair of the tunnel barrier layers is different from the thicknesses of any other pair of the tunnel barrier layers. Owing to this structure, wider carrier levels due to bias of the number of carriers between respective quantum well layers are suppressed, and QED effects of the resonator are enhanced and light emission efficiency is increased. Incidentally, a bandgap-matching layer is formed between the tunnel barrier layers.

In Patent Document 3, disclosed is a light emitting diode of a high light emission efficiency in which a plurality of quantum well layers having peak wavelengths of an emission spectrum different from each other is positioned at intervals of ½ a resonance wavelength in positions of an anti-node of a standing wave in a resonator, and whereby the carrier that gets over one quantum well layer contributes to the light emission at the next quantum well layer.

In the vertical cavity light emitting diode disclosed in Patent Document 4, the length of a resonator is ½ the light emission wavelength, a quantum well layer is provided at the center of the resonator thereof, and whereby the quantum well layer lies in a position at an anti-node of a standing wave of light; as well as the bandgaps of these respective quantum well layers are formed to be inclined or stepped, being smaller from the injection side of electrons toward the injection side of electron holes, and whereby the electrons and the electron holes are localized in the same place in respective quantum well layers to enhance spontaneous emission.

In Patent Document 5, disclosed is a vertical cavity light emitting diode which provides the quantum well layers having bandgaps different from each other in an inclined manner to form a multiple quantum well structure, whereby widening a gain bandwidth.

In Patent Document 6, disclosed is a vertical cavity light emitting diode which has quantum well layers with the same bandgap, disposes a plurality of quantum well layers having thicknesses different from each other, sets the interval of the quantum well layers to be ½ the resonance wavelength, thus forming no new levels due to coupling between respective quantum well layers, and keeps the emission spectrum of respective quantum well layers.

[Patent Document 1] Japanese Patent Application Laid-Open No. 2002-111053
[Patent Document 2] Japanese Patent Application Laid-Open No. 2000-174328
[Patent Document 3] Japanese Patent Application Laid-Open No. 10-27945
[Patent Document 4] Japanese Patent Application Laid-Open No. 2000-174327
[Patent Document 5] Japanese Patent Application Laid-Open No. 7-245449
[Patent Document 6] Japanese Patent Application Laid-Open No. 10-27945

DISCLOSURE OF THE INVENTION

Problems to be Solved by the Invention

In a surface light emitting element having a resonator structure, to improve a light emission output, a carrier needs to be confined in a quantum well layer, since the interval between the quantum well layers is sufficiently long, and a high light emission output cannot be obtained. On the other hand, in case where quantum well layers are disposed at anti-nodes of a plurality of standing waves in order to obtain a high light emission output, a forward voltage is increased, and a response speed is also decreased.

Furthermore, in the light emitting diode disclosed in Patent Document 1, due to that there is a single layer of quantum well layer, as well as the light emitting diode is not of a resonator structure, a light emission output is small. To solve these problems, although the quantum well layer needs to be multiple, in the case of applying the technique described in Patent Document 1 to a multiple quantum well layer, since each layer is thin, a doping amount is difficult to be adjusted as Patent Document 1 with respect to each of a plurality of barrier layers and quantum well layers. Furthermore, a dopant is diffused each other between the layers, and thus light emission output may be decreased.

In addition, in the vertical cavity light emitting diode disclosed in Patent Document 2, although there are included a plurality of quantum well layers, since barrier layers that are positioned between respective quantum well layers form a multiple layer structure, productivity is reduced. Further, since the interval between the quantum well layers becomes large, response characteristics are decreased, as well as a forward voltage necessary for light emission is increased.

Furthermore, in the vertical cavity light emitting diode disclosed in Patent Document 3, since the number of standing waves in the resonator needs to be increased, the resonator needs to be thicker (longer). Therefore, response characteristics are decreased, as well as a forward voltage necessary for light emission is increased.

In addition, in the vertical cavity light emitting diode disclosed in Patent Documents 4 to 6, due to that the bandgaps of a multiple quantum well layer are the same, or in a structure in which there is provided an inclination, or the bandgap in each quantum well layer is inclined, substantially the same radiative recombination is caused to occur in each quantum well layer, the purity of a spectrum is increased, and spontaneous emission by the recombination of an electron and an electron hole in the quantum well layer is enhanced in a resonance mode. However, although a high output is required for the use in, for example, POF optical communication, there are limits to the improvement in light emission only with conventional inclined quantum well layer structures.

The present invention has been made in view of such situations as mentioned above, and has an object of providing a surface light emitting element having high productivity, high light emission output, and good response characteristics, and capable of suppressing an increase of a forward voltage necessary for light emission. In addition, another object of the present invention is to provide a vertical cavity surface light emitting element in which stimulated emission effects are enhanced, and a still higher light emission can be obtained.

Means for Solving the Problems

The present inventors, as a result of intense study, have presented findings that in a surface light emitting element having a multiple quantum well layer, by setting the center-to-center distance of the quantum well layers at an appropriate value, without the multiple layer structure of barrier layers, light emission and response characteristics can be improved, as well as the increase of a forward voltage necessary for light emission can be suppressed.

To solve the above-mentioned problems, the present invention is a surface light emitting element of vertical cavity type including:

an active layer in which a quantum well layer and a barrier layer are alternately laminated; and reflective layers disposed both above and below the active layer, wherein assuming that a center-to-center distance of the plurality of quantum well layers is L, a light emission wavelength of the surface light emitting element is λ, and an average refractive index of an optical length of a resonator, being a distance between the reflective layers is n, a condition of λ/(15×n)≦L≦λ/(10×n) is satisfied.

It is preferable that a bandgap of at least one of the quantum well layers is different from that of the other quantum well layers. In this case, preferably the distance between the reflective layers is an optical length of approximately 1, 1.5 or 2 times a light emission wavelength of the quantum well layer of the smallest bandgap.

Preferably, no node of a standing wave of light to be generated between the two reflective layers is positioned in the active layer, and at least one of the quantum well layers is located in a position of an anti-node of the standing wave. Here, the anti-node of the standing wave refers to the portion where an electric field strength distribution is not less than 95% of the maximum thereof.

Furthermore, the present inventors, as a result of intense study, have focused attention on that stimulated emission in a vertical cavity surface light emitting element takes place in the region of a bandgap smaller than the bandgap corresponding to the light entering an active layer, have presented findings that in an active layer having a quantum well layer structure of at least three layers, the bandgap of the quantum well layer that is located at an anti-node of a standing wave of light to be generated, that is in a region having high electric field strength is made larger than the bandgaps of the quantum well layers on both sides of this quantum well layer being sandwiched, thereby enabling to enhance stimulated emission effects to increase emission intensity, and have completed the below-mentioned invention.

That is, a second surface light emitting element according to the present invention is a vertical cavity light emitting diode including:

an active layer including at least three layers of quantum well layers; and reflective layers formed with the active layer sandwiched therebetween, wherein among the quantum well layers, bandgaps of the outermost quantum well layers are substantially the same and smaller than those of the inside quantum well layers; and a bandgap of at least one layer of the inside quantum well layers is larger than that of the outside quantum well layer.

In the above-mentioned structure, preferably the inside quantum well layer is provided at an anti-node of a standing wave of light in a vertical resonator. In addition, preferably a length of the vertical resonator is that of approximately (m·λ)/2 (where: m is an integer), with respect to a light emission wavelength (λ) of the outermost quantum well layer. Further, preferably there is included a current-narrowing layer.

According to the above-mentioned first and second surface light emitting elements, a higher light emission output can be achieved. Further, according to the first surface light emitting element, response characteristics can be improved, as well as the increase of the forward voltage necessary for light emission can be suppressed.

EXPLANATION OF REFERENCE NUMERALS

1: surface light emitting element, 2: substrate, 3: first reflective layer, 4: first clad layer, 5: active layer, 6: second clad layer, 7: double-hetero junction layer, 8: current-narrowing layer, 8a: opening, 9: second reflective layer, 10: electrode layer, 10a: opening, 12, 13: electrode, 14: protective film, 15a, 15b: dicing line, 5a to 5c, 21 to 25, 51: quantum well layer, and 52: tunnel barrier layer

BEST MODE FOR CARRYING OUT THE INVENTION

Figure 1:
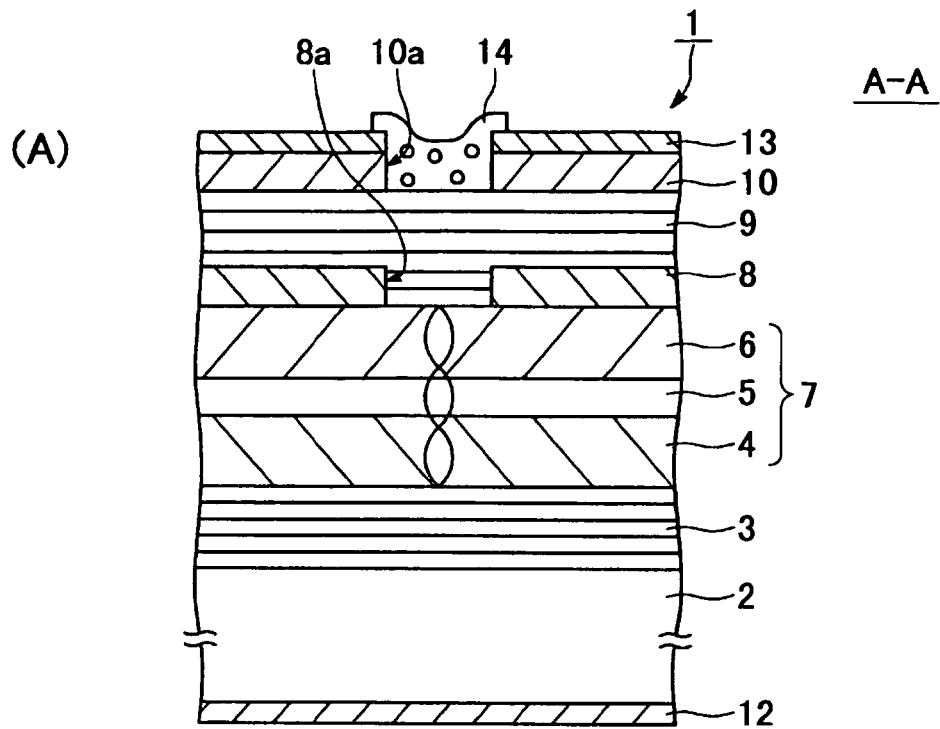
FIG. 1(A) is a sectional view for illustrating a structure of a surface light emitting element according to a first embodiment.
FIG. 1(B) is a plan view of the surface light emitting element.
Figure 1:
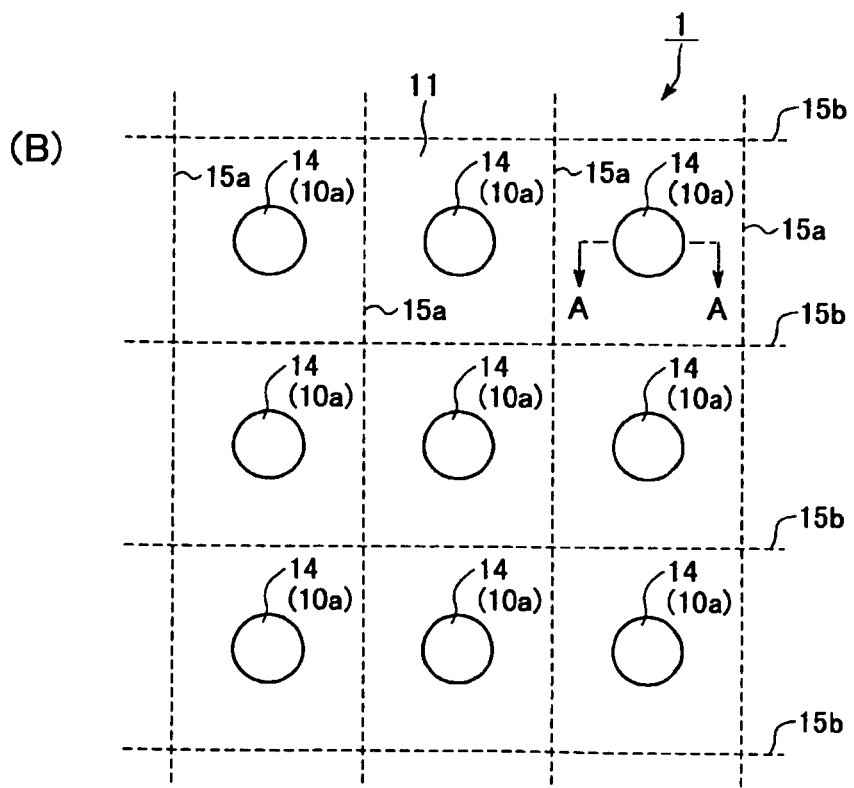

Hereinafter, embodiments according to the present invention will be described referring to the drawings. FIG. 1(A) is a sectional view for illustrating a structure of a surface light emitting element according to a first embodiment of the present invention, and FIG. 1(B) is a plan view of the surface light emitting element. FIG. 1(A) illustrates a cross section taken along the line A-A of FIG. 1(B). In FIG. 1(B), reference numerals 15a and 15b designate dicing lines.

This surface light emitting element 1 is a vertical cavity light emitting diode, and is obtained by laminating, on the surface of a substrate 2 of a first conductive type (for example, n-type), a first reflective layer 3 of the first conductive type, a first clad layer 4 of the first conductive type, an active layer 5 of the first conductive type, a second clad layer 6 of a second conducive type, a thin current-narrowing layer 8 of the first conductive type or undoped (that is, there is no intentional addition of impurities), a second reflective layer 9 of the second conductive type (for example, p-type) and an electrode layer 10 of the second conductive type in this order. The first clad layer 4, the active layer 5 and the second clad layer 6 form a double hetero junction forming a vertical resonator. An optical length of the vertical resonator is the distance between the first reflective layer 3 and the second reflective layer 9, i.e., the thickness of the double-hetero junction 7. Here, in the first clad layer 4 and the second clad layer 5, a diffusion-preventing layer may be disposed.

An electrode 12 is formed on the underside of the substrate 2, and an electrode 13 is formed on the electrode layer 10. There is formed in the electrode layer 10 and the electrode 13 an opening 10a for light emission. The planar shape of the opening 10a can be an arbitrary shape (for example, a circle, an ellipse or a rectangle). In addition, the opening 10a is covered with a protective film 14. The protective film 14 is made of materials having a high transmittance with respect to light emitted from the active layer 5, and preferably $(m \cdot \lambda)/(4 \cdot n_3)$ in thickness: where m is an odd number and $n_3$ is a refractive index of the protective film 14.

The active layer 5 is a light-emitting layer, and has a multiple quantum well structure. The structure of the active layer 5 will be described below with reference to FIG. 2.

The current-narrowing layer 8 includes an opening 8a. The opening 8a is a current path; and the electric current flowing through the electrode layer 10 is narrowed in the region where the opening 8a of the current-narrowing layer 8 is formed, and a current (carrier) density of the active layer right below the opening can be made higher. Therefore, a diode of a high light emission output as well as a high response speed can be obtained. Further, the opening 8a is a window through which light is emitted, and overlapped with the opening 10a that is formed in the electrode layer 10 and the electrode 13. That is, since the opening 8a, being the region through which the narrowed electric current flows is overlapped with the opening 10a for light emission as described above, light emission output of the surface light emitting element 1 is made higher.

In addition, the active layer 5 is sandwiched between the first reflective layer 3 and the second reflective layer 9, whereby a vertical resonator is formed. In this vertical resonator, a standing wave of light is produced. That is, light having been emitted downward from the active layer 5 is reflected by the first reflective layer 3. The reflected light from the first reflective layer 3 and the light 3 having been emitted upward from the active layer 5 enter the second reflective layer 9. A part of the light having entered the second reflective layer 9 is reflected to form a standing wave. The remaining light having entered the second reflective layer 9 is output to the outside of the surface light emitting element 1 through the opening 10a. Thus, the reflectance of the first reflective layer 3 is preferably made higher than that of the second reflective layer 9.

Here, preferably no node of a standing wave is positioned in the active layer 5, as well as at least one of the quantum well layers 51 is disposed in a position of an anti-node (that is, at a portion where an electric field strength distribution is not less than 95% the maximum value thereof) of the standing wave. Thus, light emission output of the surface light emitting element 1 can be made higher. Furthermore, assuming that the wave length of light emitted from the quantum well layer having the smallest bandgap among a plurality of quantum well layers is $\lambda$, the optical length of the vertical resonator, being the length between two reflective layers is preferably about $\lambda$, about 1.5 $\lambda$ or about 2 $\lambda$. The optical length of the vertical resonator of 0.5$\lambda$ is undesirable since dopants are diffused in the active layer, and light emission efficiency is decreased. Moreover, the optical length of not less than 2.5 $\lambda$ is undesirable since the effect of resonance is weakened, light emission output is decreased, and a forward voltage is increased.

Furthermore, an n-type GaAs buffer layer (not illustrated) may be provided between the GaAs substrate 2 and the n-type first reflective layer 3. In this case, the crystallinity of the first reflective layer 3 can be made higher. In addition, a diffusion-preventing layer of preventing the diffusion of impurities may be provided both between the active layer 5 and the first clad layer 3, and between the active layer 5 and the second clad layer 6.

Figure 2:
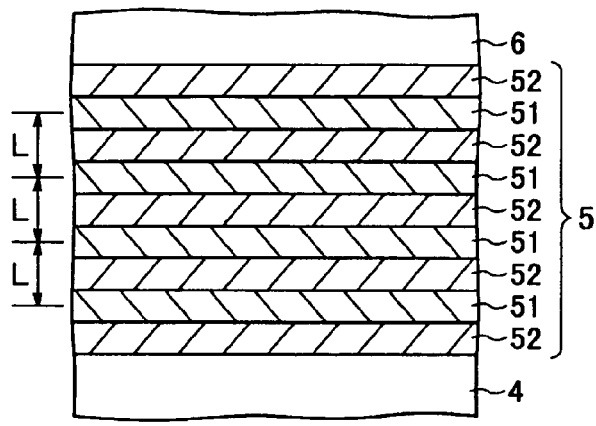
FIG. 2 is a sectional enlarged view for illustrating a structure of an active layer 5.

FIG. 2 is a sectional enlarged view for illustrating the structure of the active layer 5. The active layer 5 has a laminated structure of plural layers of alternating quantum well layers 51 and barrier layers 52. In this figure, the number of the quantum well layers 51 is three. Furthermore, although the number of the quantum well layers may be two, or not less than four, there is preferably no node of a standing wave in the active layer for the reason that the decrease of light emission output and the increase of a forward voltage can be suppressed. In addition, the center-to-center distance of adjacent quantum well layers 51, assuming that a light emission wavelength of the surface light emitting element is 1 $\lambda$, and an average refractive index of the double-hetero junction is n, satisfies the expression of $$\lambda/(15 \times n) \leq L \leq \lambda/(10 \times n) \qquad (1).$$

However, an average refractive index n is the sum of products of the refractive index of respective layers that form the double-hetero junction and the rate of the length of respective layers with respect to that of the active layer 5. For example, an average refractive index n in the case in which, for example, the film of a refractive index A is 20 nm in thickness, and the film of a refractive index B is 10 nm in thickness, is obtained by A×(20/30)+B×(10/30).

By the center-to-center distance of the quantum well layers 51 satisfying the above-mentioned expression (1), both light emission efficiency and response characteristics of the surface light emitting element 1 will be improved. When L is smaller than $\lambda/(15\times n)$, a sufficient thickness of the barrier layer 52 necessary for providing quantum effects cannot be obtained, resulting in a decreased light emission output. Furthermore, the width of the active layer becomes substantially larger, and thus there is a possibility that response characteristics are reduced. Moreover, when L is larger than $\lambda/(10\times n)$, the effect of resonance is reduced, whereby light emission output and response characteristics are decreased, as well as a forward voltage required for light emission increases. Incidentally, in the range of satisfying the above-mentioned expression, L may be the same value between all adjacent quantum well layers, or at least one L may have a value different from the other values.

Each drawing of FIGS. 3(A) to 3(D) is a diagram for illustrating the bandgap of the quantum well layer 51. In an example of FIG. 3(A), three quantum well layers 51 include the same composition, and all the bandgaps are the same.

Figure 3:
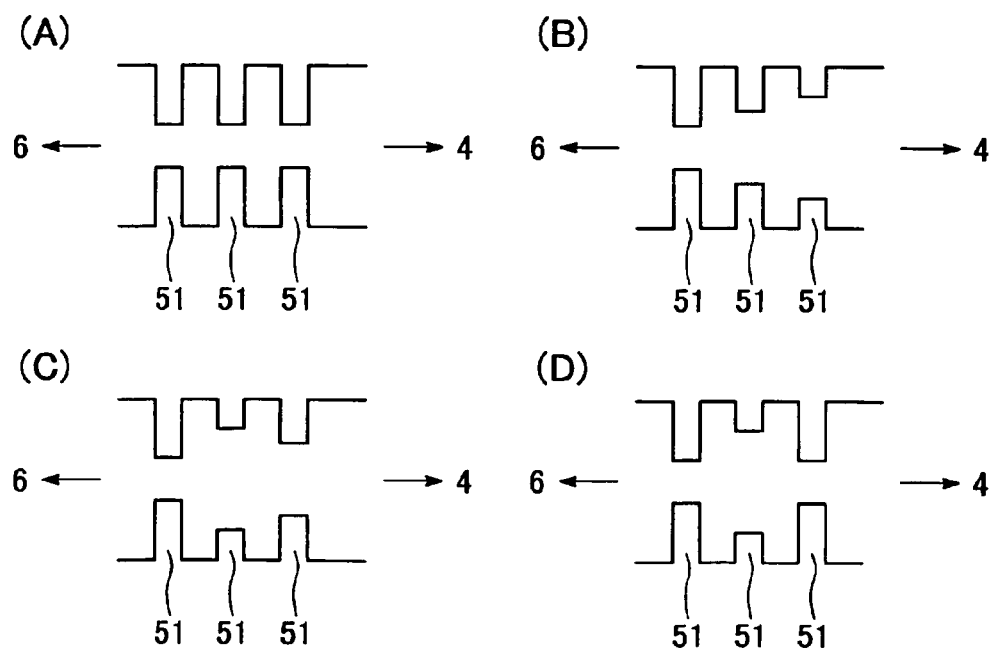
FIGS. 3(A) to 3(D) are diagrams for illustrating bandgaps of quantum well layers 51.

In examples of FIGS. 3(B) and 3(C), respective compositions of three quantum well layers 51 are different. Further, in the example illustrated in FIG. 3(B), the bandgap of the quantum well layer 51 comes to be larger with increasing proximity from the second clad layer 6 to the first clad layer 4. In addition, in the example illustrated in FIG. 3(C), the bandgap comes to be smaller in the order of the quantum well layer 51 that is most close to the second clad layer 6, the quantum well layer 51 that is most close to the first clad layer 4, and the quantum well layer 51 positioned therebetween. That is, all the bandgaps of three quantum well layers 51 are different. Furthermore, in the example illustrated in FIG. 3(D), the bandgap of the quantum well layer 51 that is positioned in the middle is the largest, as well as the bandgaps of the quantum well layers 51 most close to the first and the second clad layers are the same.

In any case of these examples, as compared with the case in which all the bandgaps are the same as illustrated in FIG. 3(A), light emission output of the surface light emitting element 1 comes to be higher. In particular, by disposing the quantum well layers 51 as illustrated in FIG. 3(D), light emission can be effectively improved; and by causing the length of the vertical resonator to be substantially the same as n/2 times (n is a positive integer) the wave length to be emitted from the quantum well layer of a small bandgap, light emission can be improved. Incidentally, in both the case in which the number of the quantum well layers 51 is two and the case in which it is not less than four, it is preferable to have the structure illustrated in each of FIGS. 3(A) to 3(D).

Now, a manufacturing method of the surface light emitting element 1 will be described. First, the first reflective layer 3 is formed on the substrate 2. The first reflective layer 3 can be formed as an epitaxial growth layer by using, for example, MOCVD method or MBE method. In the case in which the substrate 2 is an n-type GaAs substrate, the first reflective layer 3 is formed of a laminate of alternating layers of a first Bragg reflective film that is made of, for example, n-type $Al_{1-x}Ga_xAs$ film (0<x<1) and a second Bragg reflective film that is made of an n-type $Al_{1-z}Ga_zAs$ (0≦z<1 as well as z<x).

Incidentally, a buffer layer may be formed on the substrate 2 before the first reflective layer 3 is formed. In the case in which the substrate 2 is a GaAs substrate, the buffer layer is a GaAs layer.

Next, the first clad layer 4, the active layer 5, the second clad layer 6 and the current-narrowing layer 8 are formed in this order. These layers can be formed as an epitaxial growth layer using, for example, MOCVD method or MBE method.

Specifically, in the case in which the first reflective layer 3 is made of n-type $AlGa_xAs$ film (0≦x≦1), the first clad layer 4 is made of n-type $Al_xGa_yIn_{1-x-y}P$ film (0≦x≦1, 0≦y≦1 and 0≦x+y≦1).

Furthermore, the quantum well layer 51 of the active layer 5 is made of undoped $Al_xGa_yIn_{1-x-y}P$ film (0≦x≦1, 0≦y≦1 and 0≦x+y≦1), and the barrier layer 52 is made of undoped $Al_xGa_yIn_{1-x-y}P$ film (0≦x≦1, 0≦y≦1 and 0≦x+y≦1).

In addition, the second clad layer 6 and the current-narrowing layer 8 are made of p-type $Al_xGa_yIn_{1-x-y}P$ film (0≦x≦1, 0≦y≦1 and 0≦x+y≦1) and n-type $Al_xGa_yIn_{1-x-y}P$ film (0≦x≦1, 0≦y≦1 and 0≦x+y≦1) respectively.

Incidentally, the compositions of the first clad layer 4, the active layer 5 and the second clad layer 6 are selected in accordance with a desired light emission wavelength. Moreover, the first reflective layer 3 through the current-narrowing layer 8 can be formed continuously in the same manufacturing equipment. Furthermore, an etching stop layer may be formed between the second clad layer 6 and the current-narrowing layer 8. In the case in which the second clad layer 6 is made of $Al_xGa_yIn_{1-x-y}P$ film, the etching stop layer is made of, for example, $Al_xGa_yIn_{1-x-y}P$ film (0≦x≦1, 0≦y≦1 and 0≦x+y≦1).

Subsequently, the current-narrowing layer 8 is selectively removed by etching to form the opening 8a. In the case in which an etching stop layer is provided between the current-narrowing layer 8 and the second clad layer 6, a chemical etching or a plasma etching can be employed as a selected etching. Thereafter, cleaning processing is made again.

Next, on the current-narrowing layer 8 and in the opening 8a, the second reflective layer 9 is formed, and further the electrode layer 10 is formed on the second reflective layer 9. These layers can be formed as an epitaxial growth layer by employing, for example, MOCVD method or MBE method. The structure of the second reflective layer 9 is the same as that of the first reflective layer 3. In addition, the electrode layer 10 is made of, for example, GaAs film.

Incidentally, the second reflective layer 9 and the electrode layer 10 can be formed continuously in the same manufacturing equipment.

Subsequently, the electrode 13 is formed on the surface of the electrode layer 10, as well as the electrode 12 is formed on the backside of the substrate 2. Then, the electrode layer 10 and the electrode 13 are selectively removed by etching to form the opening 10a. Thereafter, the protective film 14 is formed in the opening 10a by, for example, CVD method. The protective film 14 is made of, for example, a silicon oxide film or a silicon nitride film.

Thereafter, dicing is made along the dicing lines 15a and 15b, to cut off a plurality of surface light emitting elements 1 with each other.

As described above, according to the first embodiment of the present invention, since in the active layer 5 having a multiple quantum structure, the upper limit and the lower limit of the center-to-center distance L of the quantum well layers 51 are determined as with the above-mentioned expression (1), in the surface light emitting element, respective light emission and response characteristics can be improved, as well as the increase of the forward voltage required for light emission can be suppressed. Moreover, since the structure of the barrier layer 52 is simple, a higher productivity can be obtained.

Now, a vertical cavity surface light emitting element according to a second embodiment of the present invention will be described. The surface light emitting element according to this embodiment has the same structure as that of the first embodiment except for the structure of the active layer 5.

Hereinafter, like reference numerals refer to the same structures, so that descriptions thereof will be omitted.

Figure 4:
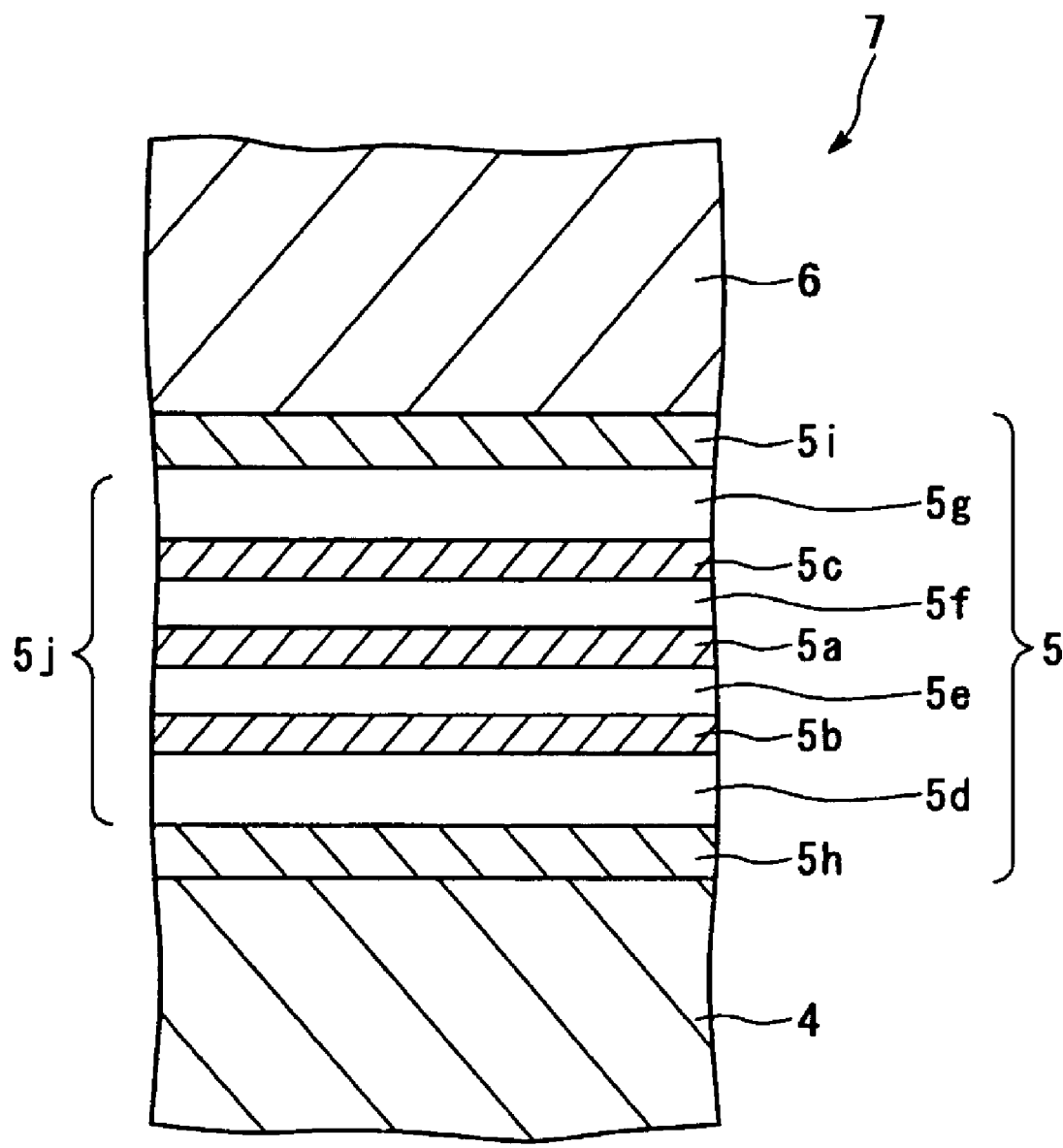
FIG. 4 is a view illustrating an enlarged sectional structure of an active layer according to a second embodiment.

FIG. 4 is a view illustrating an enlarged sectional structure of the active layer 5 of the double-hetero junction layer 7.

As illustrated in FIG. 4, the active layer 5 is inserted between the first clad layer 4 that is formed on the first reflective layer 3 and the second clad layer 6 that is formed below the second reflective layer 9. The active layer 5 is formed of a multiple quantum well layer 5j, and a first and a second diffusion-preventing layer 5h and 5i that are disposed on both sides of this multiple quantum well layer 5j. In the case illustrated in the drawing, the multiple quantum well layer 5j includes three layers of quantum well layers 5a, 5b and 5c. Inside the multiple quantum well layer 5j, a first quantum well layer 5a is formed, a second quantum well layer 5b is formed on the outside via a barrier layer 5e on the first reflective layer 3 side of the first quantum well layer 5a, as well as a third quantum well layer 5c is formed on the outside via a barrier layer 5f on the second reflective layer 9 side of the first quantum well layer 5a.

The first and second diffusion-preventing layers 5h and 5i function to prevent impurities that having been added into each of the first and second clad layers 4 and 6 from diffusing into the barrier layers 5d to 5g of the multiple quantum well layer 5j in the active layer 5.

Here, the first and second diffusion-preventing layers 5h and 5i can be of the same composition as those of the barrier layers 5d and 5g adjacent thereto, and can be the so-called non-doped layers into which no impurities are intentionally added. Furthermore, the thickness of the active layer 5 can have a predetermined thickness by adjusting the thickness of the diffusion-preventing layers 5h and 5i. Thus, the surface light emitting element 1 according to this embodiment is provided with the active layer 5 including the multiple quantum well layer 5j that is formed of at least three layers of quantum well layers, and the first and second reflective layers 3 and 9 that are formed with this active layer 5 sandwiched therebetween.

This embodiment is characterized in that in the multiple quantum well layer 5j in the active layer 5, the first quantum well layer 5a that is disposed inside is sandwiched between the outermost second and third quantum well layers 5b and 5c, as well as that the bandgap of the first quantum well layer 5a located inside is larger than those of the outermost second and third quantum well layers 5b and 5c. This first quantum well layer 5a is located at an anti-node of a standing wave of light that is generated at a resonator that is formed of the first and second reflective layers 3 and 9, that is in the region of high electric field strength.

Here, the region of high electric field strength stands for the region where electric field strength is not less than 90% the maximum thereof. In particular, the first quantum well layer 5a is preferably located in the region where electric field strength is not less than 95% the maximum of the electric field strength. Whereby, a quantum well layer of about 10 nm film thickness in which quantum effects take place can be located in the region of high electric field strength, thus enabling to strengthen light emission. In addition, the positions of the second and third quantum well layers 5b and 5c are desirably in positions where electric field strengths of the above-mentioned standing wave are equal.

Moreover, the quantum well layers are preferably of such composition and thickness that the difference in the bandgap between the first quantum well layer 5a and the second and third quantum well layers 5b and 5c, that is the difference between the maximum bandgap and the minimum bandgap of the quantum well layers in the multiple quantum well layer 5j corresponds to not less than 10 nm of a light emission wavelength. In addition, the bandgaps of the second and third quantum well layers are substantially the same that is not more than 2 nm of a light emission wavelength, thereby enabling to increase light emission output further.

In FIG. 4, although the multiple quantum well layer 5j in the active layer 5 is described to be three layers of the quantum well layers 5a to 5c, it may be the multiple quantum well layer 5j including not less than three layers such as four layers or five layers of quantum well layers. In the case in which the multiple quantum well layer 5j has five layers of quantum well layers, the bandgap of at least one quantum well layer of the quantum well layers positioned inside is larger than those of the outermost quantum well layers, and the bandgaps of the outermost quantum well layers are substantially the same, and not more than, being smaller than the bandgap of the inside quantum well layer. At this time, provision of the quantum well layer having the largest bandgap in a position of the anti-node of a standing wave of light is preferable to improve light emission. In this case, the difference between the maximum bandgap and the minimum bandgap of the quantum well layers of the multiple quantum well layer 5j is desirably not less than 10 nm and not more than 20 nm in a light emission wavelength. Due to that the difference between bandgaps is to be not less than 10 nm in a light emission wavelength, stimulated emission effects are enhanced, thus enabling to increase light emission output. This difference between the bandgaps smaller than 10 nm in a light emission wavelength is undesirable since sufficient stimulated emission effects cannot be obtained. On the contrary, the difference in a light emission wavelength not less than 20 nm is undesirable since a resonator length and a light emission wavelength differ from each other, and thus resonance effects are decreased and light emission is deteriorated.

Figure 5:
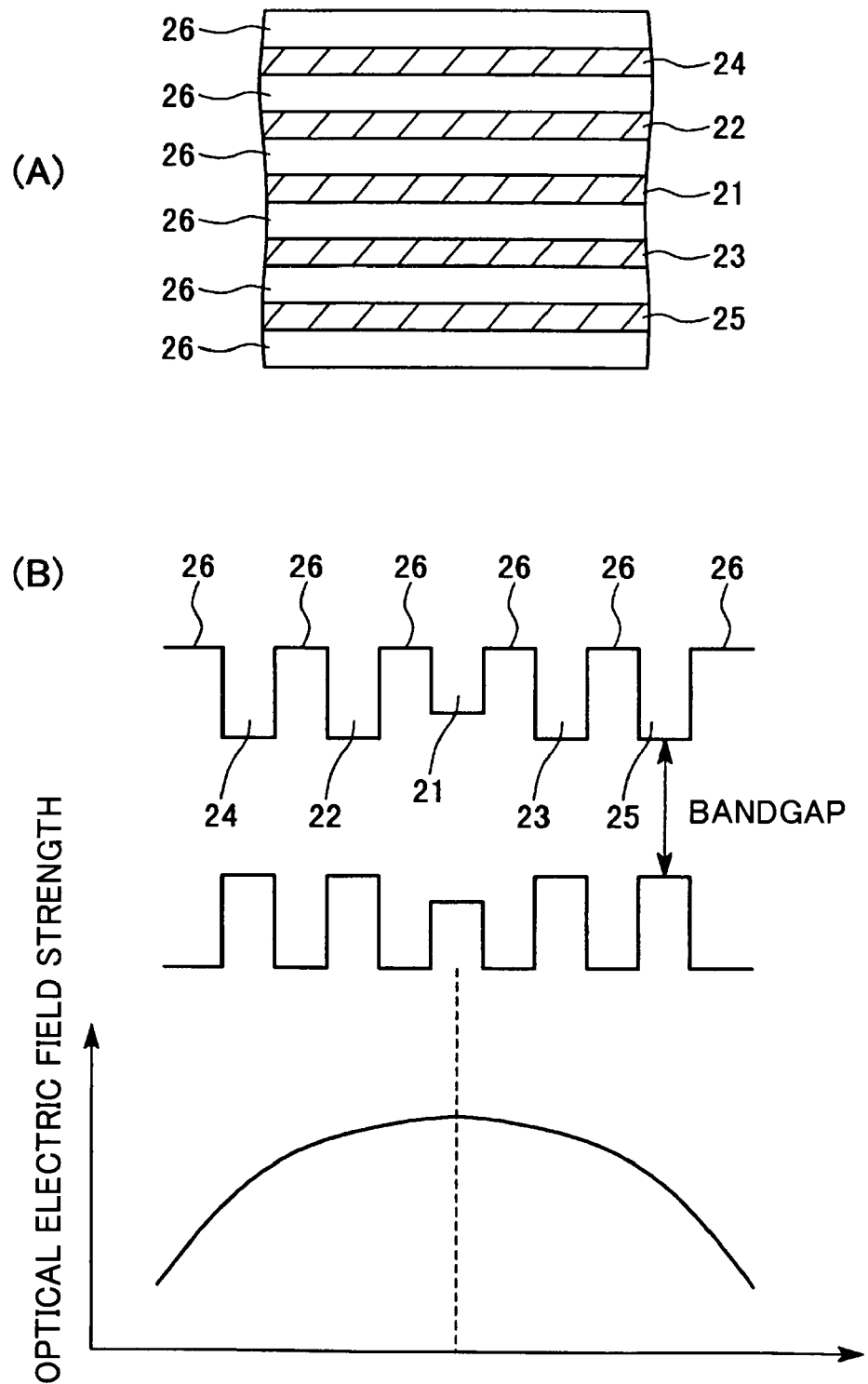
FIG. 5(A) is a sectional view in structure example 1 of a multiple quantum well layer that is formed of five layers.
FIG. 5(B) is a band diagram of FIG. 5(A) and a chart illustrating a corresponding optical electric field distribution.
Figure 6:
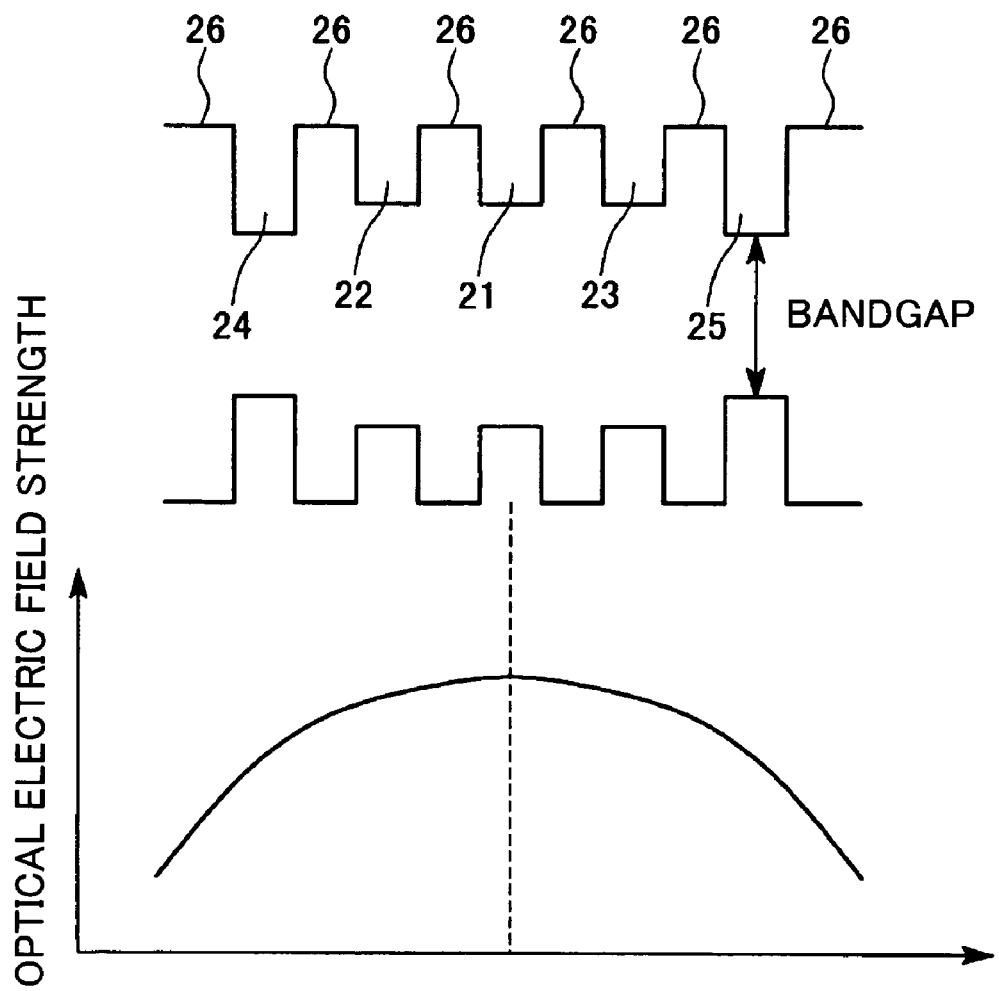
FIG. 6 is a band diagram and a chart illustrating a corresponding optical electric field distribution in structure example 2 of a multiple quantum well layer that is formed of five layers.
Figure 7:
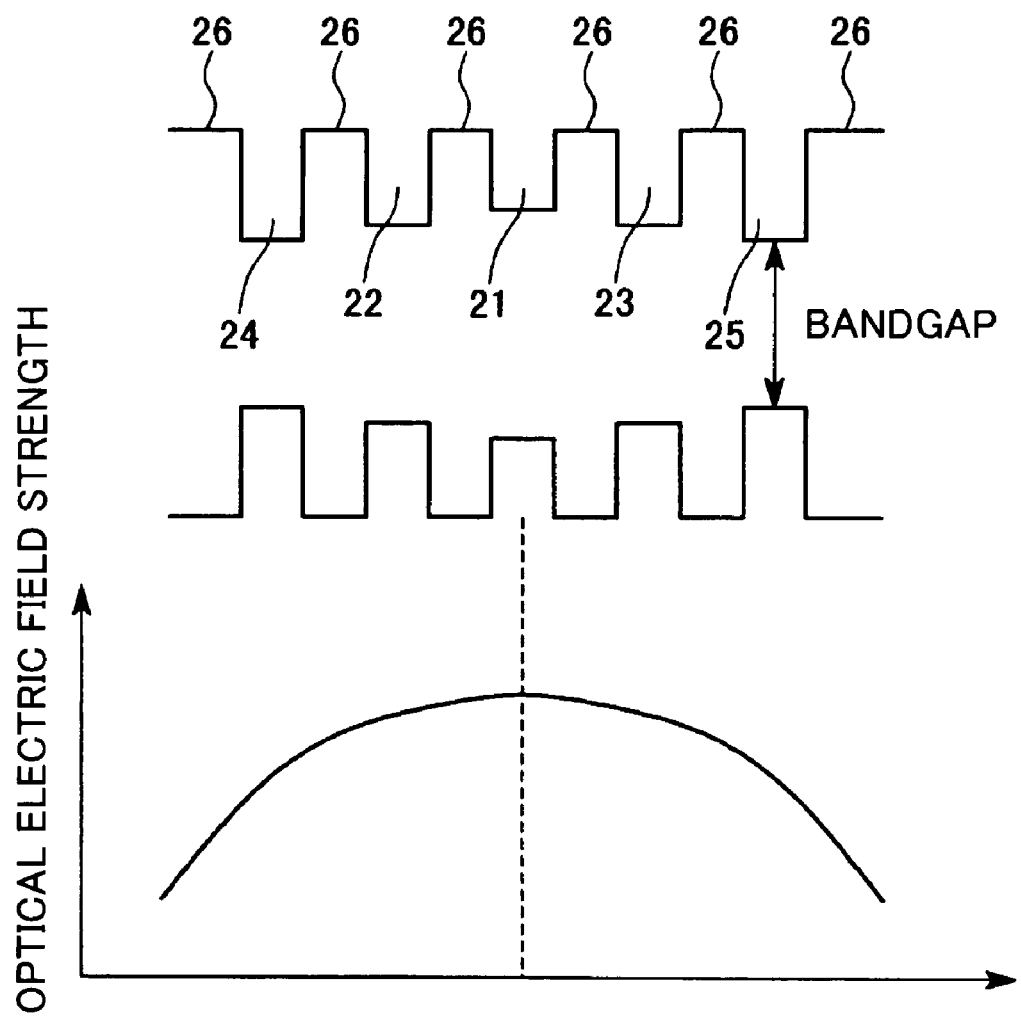
FIG. 7 is a band diagram and a chart illustrating a corresponding optical electric field distribution in structure example 3 of a multiple quantum well layer that is formed of five layers.

FIGS. 5 to 7 are diagrams schematically illustrating structure examples 1 to 3 of five layers of quantum well layers according to the present invention.

FIG. 5(A) is a sectional view in the structure example 1 of five layers of a multiple quantum well layer, and FIG. 5(B) illustrates a band diagram thereof and a corresponding optical electric field distribution.

As illustrated in FIG. 5(A), in the case of five layers of the multiple quantum well layer, there are disposed inside the outermost quantum well layers 24 and 25 three layers of inside quantum well layers 21, 22 and 23. As illustrated in FIG. 5(B), in the inside quantum well layers 21, 22 and 23, with the quantum well layer 21 of the largest bandgap sandwiched, there are disposed the quantum well layers 22 and 23 having the same bandgap which is smaller than that of the quantum well layer 21. Furthermore, the outermost quantum well layers 24 and 25 are structured to have the same bandgap as that of the inside quantum well layers 22 and 23.

FIG. 6 illustrates a band diagram and a corresponding optical electric field distribution in the structure example 2 of five layers of a multiple quantum well layer.

In the case of five layers of the multiple quantum well layer illustrated in the drawing, the three inside quantum well layers 21, 22 and 23 have the same bandgap. The outermost quantum well layers 24 and 25 are so structured as to have the same bandgap and that the value thereof is smaller than those of three layers of the inside quantum well layers 21, 22 and 23.

FIG. 7 illustrates a band diagram and a corresponding optical electric field distribution in the structure example 3 of five layers of a multiple quantum well layer.

As illustrated in FIG. 7, three layers of the inside quantum well layers 21, 22 and 23 are structured so that on both sides of the central quantum well layer 21 of the largest bandgap, the quantum well layers 22 and 23 having bandgaps smaller than that of the quantum well layer 21 are disposed respectively. As the outermost quantum well layer, the quantum well layers 24 and 25 having bandgaps still smaller than those of the inside quantum well layers 22 and 23 are disposed one on each side. In the above-mentioned quantum well layer structure example of five layers, the quantum well layer 21 having the largest bandgap is disposed at an anti-node of an optical electric field strength distribution that is a standing wave.

As in the structure examples of five layers of the multiple quantum well layer illustrated in FIGS. 5 to 7, insofar as the bandgaps of the outermost quantum well layers 24 and 25 are substantially the same, and smaller than the bandgap of at least one of the inside quantum well layers 21, 22 and 23, the other structure may be employed, for example, the quantum well layers of the largest bandgap may be the quantum well layers 22 and 23.

Now, the first and second reflective layers 3 and 9 forming the resonator of the surface light emitting element 1 according to this embodiment will be described.

The first and second reflective layers 3 and 9 form a multiple layer film of Bragg reflective layers that is, letting a laminated structure (alternating layers) of a film of $\lambda/4n1$ thickness having a high refractive index (n1) and a film of $\lambda/4n2$ thickness having a low refractive index (n2) a pair, a laminate of multiple pairs of these alternating layers. Here, $\lambda$ is a light emission wavelength of the surface light emitting element 1, and is the wavelength of a standing wave of light. In this case, by causing the reflectance of the first reflective layer 3 on the substrate 2 side to be higher than that of the upper second reflective layer 9, light having been generated in the active layer 5 can be selectively emitted through the upper second reflective layer 9. Thus, there is formed a vertical resonator between the first and second reflective layers 3 and 9. The length of this vertical resonator is the distance in the sectional direction that is in the longitudinal direction of the sheet face of the enlarged sectional view of FIG. 4 between the first and second reflective layers 3 and 9. The vertical resonator length, with respect to a light emission wavelength ($\lambda$) of the outermost quantum well layer, is preferably set to be the length of substantially $(m \cdot \lambda)/2$ (where: m is an integer). For example, the vertical resonator can be twice a light emission wavelength $\lambda$ (m=4) in thickness.

Whereby, light having been generated in the active layer 5 forms a standing wave between the first and second reflective layers 3 and 9. When the wavelength of the standing wave of this light is substantially the same as that of the light emitted from the outermost quantum well layer, preferably when the difference in wavelength is within 2 nm, the strength of light emission is increased.

The second reflective layer 9 is formed in the opening of the current-narrowing layer 8 and above this opening, and on the current-narrowing layer 8 including the opening. The opening of this current-narrowing layer 8 is to be a current path and the region through which light is output in the surface light emitting element 1. In the electrode layer 10, the position corresponding to the region in which no current-narrowing layer 8 is provided is removed so that the second reflective layer 9 is exposed. Furthermore, the electrodes 12 and 13 are formed on the substrate 2 and the electrode layer 10.

Incidentally, the current-narrowing layer 8 may be provided on the active layer 5 side, being on the inside of the second reflective layer 9, or may be provided on the electrode layer 10 side, being on the outside thereof. The current-narrowing layer 8 may not be provided on the second reflective layer 9 side, but on the first reflective layer 3 side.

As described above, in the surface light emitting element 1 according to this embodiment, with three layers of the multiple quantum well layer 5j in which the first quantum well layer 5a of a large bandgap is sandwiched between the second and third quantum well layers 5b and 5c of a small bandgap via the barrier layers 5e and 5f, light having been generated at the first quantum well layer 5a is absorbed in the second and third quantum well layers 5b and 5c, and stimulated emission takes place in the second and third quantum well layers 5b and 5c. Whereby, stimulated emission effects at the active layer 5 are enhanced, thus enabling to achieve a higher light emission output.

Accordingly, assuming that the resonance wavelength of a resonator that is formed of the first and second reflective layers 3 and 9 is a light emission wavelength ($\lambda$) of the second and third quantum well layers 5b and 5c, light having been amplified by stimulated emission can be efficiently emitted.

In addition, preferably by narrowing an electric current to flow into the active layer 7 by the provision of the current-narrowing layer 8, the strength of a generated light is increased.

Now, the manufacturing method of such a vertical cavity light emitting diode will be described.

First, using the MOCVD method or the MBE method, on the GaAs substrate 2, as the first epitaxial growth layer, the first reflective layer 3 that is formed of a laminate of alternating layers of n-type $Al_rGa_{1-r}As/AlAs$ (r is Al composition, and $0<r<1$), the first clad layer 4 made of n-type $Al_xGa_yIn_{1-x-y}P$ ($0 \leq x \leq 1, 0 \leq y \leq 1$, and $0 \leq x+y \leq 1$), the active layer 5 formed of the first diffusion-preventing layer 5h/the barrier layer 5d/the second quantum well layer 5b/the barrier layer 5e/the first quantum well layer 5a/the barrier layer 5f/the third quantum well layer 5c/the barrier layer 5g/the second diffusion-preventing layer 51 that are of varied compositions of undoped $Al_xGa_yIn_{1-x-y}P$ ($0 \leq x23\ 1, 0 \leq y \leq 1$, and $0 \leq x+y \leq 1$) into which no impurities are added, the second clad layer 6 made of p-type $Al_xGa_yIn_{1-x-y}P$ ($0 \leq x \leq 1, 0 \leq y \leq 1$, and $0 \leq x+y \leq 1$), and the current-narrowing layer 8 made of n-type $Al_xGa_yIn_{1-x-y}P$ ($0 \leq x \leq 1, 0 \leq y \leq 1$, and $0 \leq x+y \leq 1$) are grown one by one in predetermined thicknesses. Here, an epitaxial wafer is taken out.

In the process of growing the first epitaxial growth layer, the position of the first quantum well layer 5a, taking the electric field distribution of a standing wave to be formed in the resonator into consideration, is made to grow in the position having the highest electric field strength. Furthermore, the bandgap, the thickness, and the wavelength of a standing wave of light that are determined by the composition of each quantum well layer can be set as appropriate.

Next, a patterning process is performed, and the current-narrowing layer 8 is partially removed to form the opening 8a, to make a cleaning process again. Such the so-called selective etching employs a chemical etching method or a plasma etching method by dry etching.

Subsequently, on the current-narrowing layer 8 formed with the opening 8a, embedded epitaxial growth is performed. As is the first growth, in this second growth, the second reflective layer 9 that is formed of the laminate of alternating layers of p-type $Al_rGa_{1-r}As/AlAs$ (r is Al composition, and $0<r<1$.) and the electrode layer 10 of p-type GaAs are grown in order.

Next, through the process of forming the electrodes 12 and 13 on the surface of the epitaxial growth and on the substrate backside, the process of forming the protective film 14 by e.g., the CVD method, and the dicing process, the surface light emitting element 1 can be manufactured. Here, the protective film 14 can be formed by depositing a silicon oxide film or a silicon nitride film by e.g., the plasma CVD method. This protective film 14 is $(m/4) \times (\lambda/n)$ in thickness (where: m is an odd number, and n is the refractive index of the oxide film or the nitride film), and preferably the film of a high transmittance with respect to light.

According to the manufacturing method of this surface light emitting element 1, the first reflective layer 3, the active layer 5 having a predetermined multiple quantum well layer 5j, the current-narrowing layer 8 and the second reflective layer 9 can be manufactured by two times of epitaxial growths, so that the surface light emitting element 1, being a vertical cavity light emitting diode can be produced with high yield.

Example 1

First Example

A plurality of samples was prepared by the method described in the above-mentioned first embodiment, and characteristics of each sample were evaluated. Results are shown in Tables 1 to 4. Incidentally, a cutoff frequency of evaluated characteristics indicates the frequency at the time when as the frequency of an applied power is increased, the surface light emitting element cannot follow, and the optical power becomes half the initial value. Measurement of the cutoff frequency was made by causing each sample (surface light emitting element) to emit light while increasing the frequency using a pulse generator, and receiving the light emission with APD (avalanche photo diode) to measure the optical power. As to light emission, the entire optical power was measured using integrating sphere.

TABLE 1

|  | Center-to-center distance of quantum well layers | Width of barrier layer | Optical power |
|---|---|---|---|
| Sample 1 (example) | 13.0 nm (13.3 nm) | $\lambda/(14 - n)$ | 5 nm | 1.35 mW |
| Sample 2 (example) | 18 nm (18.6 nm) | $\lambda/(10 - n)$ | 11 nm | 1.33 mW |
| Sample 3 (comparative example) | 23 nm (23.2 nm) | $\lambda/(8 - n)$ | 15 nm | 1.04 mW |

In table 1, the active layers 5 of samples 1 to 3 have the same structure each other except for the center-to-center distance of the quantum well layers 51. In each of these samples, the number of layers of the quantum well layers 51 is three, and the composition and the film thickness of these three quantum well layers 51 are the same ($In_{0.575}Ga_{0.425}P$, and 8 nm). Furthermore, the barrier layer is $(Al_{0.7}Ga_{0.3})_{0.5}In_{0.5}P$, and the clad layer is $Al_{0.5}In_{0.5}GaP$; and the average refractive index n in the double-hetero junction 7 is 3.556, and the light emission wavelength is 662 nm. The film thickness of the barrier layer 52 and the center-to-center distance of the quantum well layers 51 of the sample 1 are 5 nm and 13 nm ($\lambda/14 \cdot n$), respectively; the film thickness of the barrier layer 52 and the center-to-center distance of the quantum well layers 51 of the sample 2 are 10 mm and 18 mm ($\lambda/10 \cdot n$), respectively; and the film thickness of the barrier layer 52 and the center-to-center distance of the quantum well layers 51 of the sample 3 are 15 nm and 23 nm ($\lambda/8 \cdot n$), respectively. In addition, in the samples 1 to 3, both the first clad layer and the second clad layer are 95.5 mm. Furthermore, although there is provided between each of two clad layers and the active layer 5 a diffusion-preventing layer of the same composition as that of the barrier layer 52, the thickness of the diffusion-preventing layer is 27 nm in the sample 1, 17 nm in the sample 2, and 7 mm in the sample 3. In any sample, the standing wave in the vertical resonator resonates in $2\lambda$. Therefore, no node of the standing wave is positioned in the active layer 5, as well as the quantum well layer 51 that is positioned in the center is located at the anti-node of the standing wave.

The samples 1 and 2 are the examples of the present invention, and the optical powers are indicated to be high values of 1.33 to 1.35 mW. With respect to these examples, the sample 3 is the comparative example, since the center-to-center distance of the quantum well layers 51 is longer than the range the present invention determines, the optical power is relatively low, being 1.04 mW. From these results, it turned out that when the center-to-center distance of the quantum well layers 51 is out of the range the present invention determines, light emission is decreased.

TABLE 2

|  | Center-to-center distance of quantum well layers | Width of barrier layer | Optical power |
|---|---|---|---|
| Sample 4 (example) | 13.0 nm (13.3 nm) | $\lambda/(14 - n)$ | 5 nm | 1.49 mW |
| Sample 5 (example) | 18 nm (18.6 nm) | $\lambda/(10 - n)$ | 11 nm | 1.46 mW |
| Sample 6 (comparative example) | 23 nm (23.2 nm) | $\lambda/(8 - n)$ | 15 nm | 1.22 mW |

In the table 2, samples 4 to 6, except that the compositions of the quantum well layers 51 are inclined, have the same constructions as those of the samples 1 to 3 respectively. The compositions of the quantum well layers 51 in the samples 4 to 6 are so inclined as to be $In_{0.534}Ga_{0.466}P$, $In_{0.555}Ga_{0.445}P$, $In_{0.575}Ga_{0.425}P$ in the order from the lower layer (that is from the substrate side). The average refractive index n in the double-hetero junction 7 is 3.556, and the light emission wavelengths are 650 mm, 655 mm and 662 mm in the order from the lower layer. In any sample, the standing wave in the vertical resonator, that is the light emitted from the quantum well layer 51 of the smallest bandgap resonates in $2\lambda$ ($\lambda = 662$ mm). Therefore, three quantum well layers 51 are positioned between nodes adjacent to each other of the standing wave, as well as the quantum well layer 51 that is positioned at the center is located at an anti-node of the standing wave.

The samples 4 and 5 are the examples of the present invention, and the optical powers are indicated to be high values of 1.46 mW to 1.49 mW. Furthermore, since the bandgap of one quantum well layer 51 (specifically, the quantum well layer 51 positioned most close to the light emission side, that is on the surface side) is small as compared with the others, the optical power becomes larger as compared with the samples 1 and 2. With respect to these samples, the sample 6 is the comparative example, since the center-to-center distance of the quantum well layers 51 is longer than the range the preset invention determines, the optical power is relatively low, being 1.22 mW.

TABLE 3

| | Quantum well layer number | Center-to-center distance of quantum well layers | | Width of barrier layer | Optical power | Cutoff frequency | Vf |
|---|---|---|---|---|---|---|---|
| Sample 7 (example) | 3 | 13.0 nm (13.3 nm) | $\lambda/(14 \cdot n)$ | 5 nm | 1.53 mW | 75.4 MHz | 2.10 V |
| Sample 8 (example) | 3 | 18 nm (18.6 nm) | $\lambda/(10 \cdot n)$ | 11 nm | 1.50 mW | 74.2 MHz | 2.09 V |
| Sample 9 (comparative example) | 3 | 23 nm (23.2 nm) | $\lambda/(8 \cdot n)$ | 15 nm | 1.25 mW | 74.6 MHz | 2.02 V |
| Sample 10 (comparative example) | 6 | 13.0 nm (13.3 nm) | $\lambda/(14 \cdot n)$ | 5 nm | 1.55 mW | 59.2 MHz | 2.21 V |
| Sample 11 (comparative example) | 6 | 18 nm (18.6 nm) | $\lambda/(10 \cdot n)$ | 11 nm | 1.50 mW | 59.3 MHz | 2.28 V |
| Sample 12 (comparative example) | 6 | 23 nm (23.2 nm) | $\lambda/(8 \cdot n)$ | 15 nm | 1.25 mW | 59.0 MHz | 2.29 V |

In the table 3, samples 7 to 9 have the same structure as those of the samples 1 to 3 respectively except that the quantum well layer 51 in the middle of three quantum well layers 51 is different from the others in composition, that is the quantum well layers 51 most close to the first and the second clad layers have substantially the same bandgap, and the quantum well layer 51 having a larger bandgap is located at the center. In the samples 7 to 9, the composition of the middle quantum well layer 51 is $In_{0.534}Ga_{0.466}P$, and the composition of the other quantum well layers 51 is $In_{0.575}Ga_{0.425}P$. The average refractive index in the double-hetero junction 7 is 3.556, and the light emission wavelengths are 662 nm, 650 nm and 662 nm in the order from the lower layer. In any sample, the standing wave in the vertical resonator, that is the light emitted from the quantum well layer 51 of the smallest bandgap resonates in $2\lambda$ ($\lambda=662$ mm). Therefore, no node of the standing wave is positioned in the active layer 5, as well as the quantum well layer 51 that is positioned in the center is positioned at an anti-node of the standing wave.

The samples 7 and 8 are the examples of the present invention, and the optical powers are indicated to be high values of 1.50 mW to 1.53 mW. With respect to these examples, the sample 9 is the comparative example, since the center-to-center distance of the quantum well layers 51 is longer than the range the present invention determines, the optical power is relatively low, being 1.25 mW.

Furthermore, samples 10 to 12 are the comparative examples, and have the same structure as those of the samples 7 to 9 respectively except that the number of layers of the quantum well layers is six. The compositions of respective quantum well layers 51, in the order from the lower layer, two layers of $In_{0.575}Ga_{0.425}P$, two layers of $In_{0.534}Ga_{0.466}P$, and two layers of $In_{0.575}Ga_{0.425}P$. Since the number of layers of the quantum well layers 51 is six, the thickness of the active layer 5 of the samples 10 to 12 is larger than that of the active layer 5 of the samples 7 to 9; and the standing wave in the vertical resonator that is the light emitted from the quantum well layer 51 of the smallest bandgap resonates in $2.0\lambda$ ($\lambda=662$ nm). Therefore, the node of the standing wave is positioned in the active layer 5, and the quantum well layers 51 are positioned at a plurality of the anti-nodes. As a result, the cutoff frequency that is response characteristics are decreased as compared with the samples 7 and 8. In addition, the forward voltage Vf necessary for light emission is high as compared with the samples 7 and 8. Furthermore, the samples 9 and 12, since the center-to-center distance is longer than the range the present invention determines, the optical power is relatively low, being 1.25 mW.

TABLE 4

| | Quantum well layer number | Center-to-center distance of quantum well layers | | Width of barrier layer | Optical power | Cutoff frequency | Vf |
|---|---|---|---|---|---|---|---|
| Sample 13 (example) | 3 | 13.0 nm (13.3 nm) | $\lambda/(14 \cdot n)$ | 5 nm | 1.10 mW | 80.1 MHz | 1.84 V |
| Sample 14 (example) | 3 | 18 nm (18.6 nm) | $\lambda/(10 \cdot n)$ | 11 nm | 1.11 mW | 81.1 MHz | 1.86 V |
| Sample 15 (comparative example) | 3 | 23 nm (23.2 nm) | $\lambda/(8 \cdot n)$ | 15 nm | 0.95 mW | 79.8 MHz | 1.87 V |
| Sample 16 (comparative example) | 6 | 13.0 nm (13.3 nm) | $\lambda/(14 \cdot n)$ | 5 nm | 1.15 mW | 42.0 MHz | 2.34 V |
| Sample 17 (comparative example) | 6 | 18 nm (18.6 nm) | $\lambda/(10 \cdot n)$ | 11 nm | 1.20 mW | 40.2 MHz | 2.31 V |
| Sample 18 (comparative example) | 6 | 23 nm (23.2 nm) | $\lambda/(8 \cdot n)$ | 15 nm | 1.03 mW | 41.2 MHz | 2.29 V |
| Sample 19 (comparative example) | 9 | 13.0 nm (13.3 nm) | $\lambda/(14 \cdot n)$ | 5 nm | 1.01 mW | 28.0 MHz | 2.94 V |
| Sample 20 (comparative example) | 9 | 18 nm (18.6 nm) | $\lambda/(10 \cdot n)$ | 11 nm | 1.15 mW | 26.4 MHz | 2.89 V |
| Sample 21 (comparative example) | 9 | 23 nm (23.2 nm) | $\lambda/(8 \cdot n)$ | 15 nm | 0.89 mW | 26.0 MHz | 2.91 V |

In the table 4, samples 13 to 15 have the same structure as those of the samples 1 to 3 except for the composition of the quantum well layers 51. In the samples 13 to 15, the composition of the quantum well layer is $In_{0.004}Ga_{0.996}As$. Further, the composition of the barrier layer is $Al_{0.3}Ga_{0.7}As$, the composition of the clad layer is $Al_{0.3}In_{0.7}GaAs$, the average refractive index n in the double-hetero junction 7 is 3.446, and the light emission wavelength is 870 nm. Furthermore, since the thicknesses of two clad layers and two diffusion-preventing layers are different from those of the samples 1 to 3, also in the samples 13 to 15, the standing wave in the vertical resonator resonates in 1.5λ. Therefore, no node of the standing wave is positioned in the active layer 5, as well as the quantum well layer 51 positioned in the center is located at the anti-node of the standing wave.

The samples 13 and 14 are the examples of the present invention, and the optical powers are indicated to be high values of 1.10 mW to 1.11 mW. With respect to these samples, the sample 15 is the comparative examples, since the center-to-center distance of the quantum well layers 51 is longer than the range the present invention determines, the optical power is relatively low, being 0.95 mW.

Furthermore, samples 16 to 18 are the comparative examples, and have the same structure as those of the samples 13 to 15 except that the number of layers of the quantum well layers 51 is six. In addition, samples 19 to 21 are the comparative examples, and have the same structure as those of the samples 13 to 15 respectively except that the number of layers of the quantum well layers 51 is nine. Since there are a large number of layers of the quantum well layers 51, the thicknesses of the active layer 5 in the samples 16 to 21 is larger than those of the samples 13 to 15, and the standing wave in the vertical resonator resonates in 2.0λ in the samples 16 to 18, and resonates in 2.5λ in the samples 19 to 21. Therefore, the node of the standing wave is positioned in the active layer 5, and the quantum well layers 51 are positioned at a plurality of the anti-nodes. As a result, the cutoff frequency that is response characteristics are decreased as compared with the samples 13 and 14. In addition, the forward voltage Vf necessary for light emission is high as compared with the samples 13 and 14.

From the above-described examples and comparative examples, it turned out that in the active layer 5 having a multiple quantum structure, by determination of the upper limit and the lower limit of the center-to-center distance L of the quantum well layers 51 as in the above-mentioned expression (1), in a surface light emitting element, respective light emission and response characteristics can be improved, as well as the increase of the forward voltage required for light emission can be suppressed.

Second Example

Now, an example corresponding to the above-mentioned second embodiment will be described. First, the manufacturing method of the vertical cavity surface light emitting element according to the example will be described.

First, as a first process, using the MOCVD method, on the GaAs substrate 2, as the first epitaxial growth layer, 1995 nm of the first reflective layer 3 that is made of 20.5 pairs of n-type $Al_{0.45}Ga_{0.55}As$ (45 nm)/AlAs (52.5 nm), the first clad layer 4 made of n-type $Al_{0.5}In_{0.5}P$, the first diffusion-preventing layer 5h made of $(Al_{0.7}Ga_{0.3})_{0.5}In_{0.5}P$, the active layer 5 formed of three layers of the quantum well layers 5a to 5c that are made of $In_xGa_{1-x}P$ and the barrier layers 5d to 5g made of $(Al_{0.7}Ga_{0.3})_{0.5}In_{0.5}P$, the second diffusion-preventing layer 5i made of $(Al_{0.7}Ga_{0.3})_{0.5}In_{0.5}P$, the second clad layer 6 made of p-$Al_{0.5}In_{0.5}P$, and the current-narrowing layer 8 made of n-type $Al_{0.5}In_{0.5}P$ were grown one by one.

In the example, in the structure of the multiple quantum well layers 5j, the first to third quantum well layers 5a, 5b and 5c were 8 nm in thickness. As to the bandgap of each quantum well layer, the composition x of the first quantum well layer 5a was 0.534 and the composition x of the second and third quantum well layers 5b and 5c was 0.575 so that the bandgap (1.907 eV) of the first quantum well layer 5a is larger than that (1.873 eV) of the second and third quantum well layers 5b and 5c. Incidentally, the above-mentioned bandgap is an estimated value from composition. Accordingly, the light emission wavelength of the first quantum well layer 5a is 650 nm, the light emission wavelength of the second and third quantum well layers 5b and 5c corresponds to 662 nm, and thus the light emission wavelength of the inside quantum well layer 5a was made to be shorter by 12 nm. The resonance wavelength of the resonator, in accordance with the light emission wavelength λ (662 nm) of the second and third quantum well layers 5b and 5c, was designed to be 2λ.

In this step, the epitaxial wafer was taken out.

Next, as the second process, a patterning process in which the opening 8a is formed was performed, and the current-narrowing layer 8 was partially removed in the region to be the opening 8a, to perform a cleaning process again.

Subsequently, on the current-narrowing layer 8 formed with the opening 8a, embedded epitaxial growth was performed. In this second growth, as is the first growth, by the MOCVD method, the second reflective layer 9 that is formed of 10.5 pairs of p-type $Al_{0.45}Ga_{0.55}As$ (45 nm)/AlAs (52.5 nm) of 1020 nm thickness, and the electrode layer 10 of p-type GaAs of 100 nm thickness were grown in order.

Thereafter, through the process of forming 800 nm of the electrode 13 that is made of two layers of Au/AnSbZn on the surface of the epitaxial growth face, and forming the electrode 12 that is made of AuGeNi alloy onto the substrate backside, the process of forming the protective film, and the dicing process, the surface light emitting element 1 was manufactured.

Now, the comparative example will be described.

In a comparative example 1, except that the In composition x of the first to the third quantum well layers 5a, 5b and 5c in the multiple quantum well layer 5j is the same 0.575 (The bandgap is about 1.873 eV) in the first epitaxial growth of the example, as is the example, the vertical cavity light emitting diode was manufactured.

In a comparative example 2, as is the example, the vertical cavity light emitting diode was manufactured except that in the first epitaxial growth, the composition of each quantum well layer in the multi quantum well layer 5j, the In composition x of the first quantum well layer 5a is 0.575 (The bandgap is about 1.873 eV.), the In composition x of the second and third quantum well layers 5b and 5c is 0.534 (The bandgap is about 1.907 eV.), and thus the bandgap of the first quantum well layer 5a is smaller than that of the second and third quantum well layers 5b and 5c. At this time, the light emission wavelength of the first quantum well layer 5a is 662 nm, and the light emission wavelength of the second and third quantum well layers 5b and 5c corresponds to 650 nm. That is, the light emission wavelength of the inside quantum well layer 5a is longer than that of the outside second and third quantum well layers 5b and 5c by 5 nm.

In a comparative example 3, in the first epitaxial growth, as to the composition of each quantum well layer in the multiple quantum well layer 5j, the In composition x of the first quantum well layer 5a was 0.555 (The bandgap is about 1.893 eV.), the In composition x of the second quantum well layer 5b was 0.534 (The bandgap is about 1.907 eV.), and the In composition x of the third quantum well layer 5c was 0.575 (The bandgap is about 1.873 eV.). That is, except that the In composition x of each quantum well layer is increased in the order from the first clad layer 4 side to the second clad layer 6 side, and the bandgap of each quantum well layer is decreased as with increasing proximity to the second clad layer 6 side, as is the example, the vertical cavity light emitting diode was manufactured. At this time, the light emission wavelengths of the first, second and third quantum well layers 5a, 5b and 5c correspond to 655 nm, 650 nm and 662 nm respectively, and the light emission wavelength was increased in the order from the first clad layer 4 side to the second clad layer 6 side.

Next, emission intensities of the vertical cavity light emitting diodes that were manufactured in the example and the comparative examples 1 to 3 were measured. Results thereof will be shown in a table 5. In the table 5, the bandgap (eV) of each quantum well layer 5a to 5c in the vertical cavity light emitting diodes of the example and the comparative examples will be shown as well.

TABLE 5

|  |  | Example | Comparative example 1 | Comparative example 2 | Comparative example 3 |
|---|---|---|---|---|---|
| Bandgap (eV) | First quantum well layer | 1.907 | 1.873 | 1.873 | 1.893 |
|  | Second quantum well layer | 1.873 | 1.873 | 1.907 | 1.907 |
|  | Third quantum well layer | 1.873 | 1.873 | 1.907 | 1.873 |
|  | Optical power(mW) | 1.44 | 1.33 | 1.19 | 1.4 |
|  | Rate of increase of optical power with the comparative example 1 as a reference | +8.3% | — | −10.5% | +5.3% |

The optical powers of the vertical cavity light emitting diode having been manufactured were 1.44 mW in the example, 1.33 mW in the comparative example 1, 1.19 mW in the comparative example 2, and 1.40 mW in the comparative example 3.

In examination of the example with the case of the comparative example 1 in which the compositions of respective quantum well layers are the same as a reference, the optical power was increased by 8.3%. Whereby, it turned out that sandwiching the first quantum well layer 5a of a large bandgap between the second and third quantum well layers 5b and 5c of smaller bandgaps can increase the optical power.

On the other hand, in the comparative example 2, in examination with the case of the comparative example 1 as a reference, the optical power was decreased by 10.5%. Whereby, it turned out that even sandwiching the first quantum well layer 5a of a small bandgap between the second and third quantum well layers 5b and 5c of larger bandgaps cannot increase the optical power.

Furthermore, in the comparative example 3, in examination with the case of the comparative example 1 as a reference, the optical power was increased by 5.3%. From this result, the rate of increase of the optical power of the example is about 1.6 times larger than that of the case of the comparative example 3; and it turned out that sandwiching the first quantum well layer 5a of a large bandgap between the second and third quantum well layers 5b and 5c of smaller bandgaps is effective for increasing the optical power.

From the above-described results, it turned out that in a standing wave of light to be generated, due to the fact that the first quantum well layer 5a of a large bandgap is located in the region of a high electric field strength, the second and third quantum well layers 5b and 5c of smaller bandgaps on both sides of this first quantum well layer, that is in the regions where the electric field strengths of the standing wave are equal, and thereby light emission output of the vertical cavity light emitting diode can be increased.

The present invention is not limited to the vertical cavity light emitting diode according to the above-mentioned examples, the structure of the multiple quantum well layer, the size of the opening, the thickness of the vertical resonator or the size of a chip can be modified according to the light emitting wavelength or the magnitude of the optical power within the scope of the present invention described in claims, and it is a matter of course that these features are included within the scope of the present invention.

The invention claimed is:

1. A vertical-cavity surface light emitting element comprising:
    an active layer comprising alternately laminated quantum well layers and barrier layers; and
    reflective layers respectively disposed above and below said active layer, wherein:
    a center-to-center distance of said quantum well layers is L,
    a light emission wavelength of said surface light emitting element is $\lambda$,
    an average refractive index of an optical length of a resonator, being a distance between said reflective layers, is n,
    a condition of $\lambda/(15 \times n) \leq L \leq \lambda/(10 \times n)$ is satisfied, and
    a bandgap of at least one of said quantum well layers is different from that of another of said quantum well layers.

2. The vertical-cavity surface light emitting element according to claim 1, wherein a distance between said reflective layers is an optical length of approximately 1, 1.5 or 2 times a light emission wavelength of a quantum well layer having the smallest bandgap among said quantum well layers.

3. The vertical-cavity surface light emitting element according to claim 1, wherein no node of a standing wave of light to be generated between said reflective layers is positioned in said active layer, and at least one of said quantum well layers is located in a position of an anti-node of said standing wave.

4. The vertical-cavity surface light emitting element according to claim 1, further comprising a current-narrowing layer.

5. The vertical-cavity surface light emitting element according to claim 1, wherein:
    said active layer includes at least three quantum well layers; and
    among the quantum well layers are included outermost quantum well layers and one or more inside quantum well layers, and bandgaps of the outermost quantum well layers are substantially the same or smaller than bandgaps of the inside quantum well layers; and
    a bandgap of at least one of the inside quantum well layers is larger than that of at least one of the outside quantum well layers.

6. The vertical-cavity surface light emitting element according to claim 5, wherein at least one of said one or more inside quantum well layers is provided at an anti-node of a standing wave of light in a vertical resonator.

7. The vertical-cavity surface light emitting element according to claim 5, wherein a length of said vertical resonator is approximately $(m \cdot \lambda)/2$ (where m is an integer), with respect to a light emission wavelength ($\lambda$) of at least one of said outermost quantum well layer.

8. The vertical-cavity surface light emitting element according to claim 5, further comprising a current-narrowing layer.

* * * * *